(12) United States Patent
Eberhard et al.

(10) Patent No.: US 8,354,682 B2
(45) Date of Patent: Jan. 15, 2013

(54) RADIATION EMITTING ELEMENT

(75) Inventors: Franz Eberhard, Regensburg (DE);
Stefan Grötsch, Lengfeld-bad Abbach (DE); Norbert Linder, Lappersdorf (DE); Jürgen Moosburger, Regensburg (DE); Klaus Streubel, Laaber (DE); Ralph Wirth, Pettendorf-Adlersberg (DE); Matthias Sabathil, Regensburg (DE); Julius Muschaweck, Gauting (DE); Krister Bergenek, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 1015 days.

(21) Appl. No.: 11/891,783

(22) Filed: Aug. 13, 2007

(65) Prior Publication Data
US 2008/0035944 A1 Feb. 14, 2008

(30) Foreign Application Priority Data

Aug. 11, 2006 (DE) .......................... 10 2006 037 736

(51) Int. Cl.
*H01L 33/00* (2010.01)
(52) U.S. Cl. .................. 257/98; 257/E33.071
(58) Field of Classification Search .................. 349/62, 349/63, 64, 65; 257/98, 99, E33.056, E33.072, 257/E33.073, E33.001; 362/583
See application file for complete search history.

(56) References Cited

U.S. PATENT DOCUMENTS

| 5,139,879 | A | * | 8/1992 | Aharoni et al. | 428/422 |
|---|---|---|---|---|---|
| 5,407,733 | A | | 4/1995 | Bjornard et al. | |
| 6,122,103 | A | | 9/2000 | Perkins et al. | |
| 6,243,199 | B1 | | 6/2001 | Hansen et al. | |
| 7,283,577 | B2 | | 10/2007 | Schmid et al. | |
| 2003/0015713 | A1 | | 1/2003 | Yoo | |
| 2004/0085660 | A1 | * | 5/2004 | Hara | 359/883 |
| 2005/0185416 | A1 | | 8/2005 | Lee et al. | |
| 2006/0027818 | A1 | * | 2/2006 | Yoo | 257/79 |
| 2006/0066192 | A1 | | 3/2006 | Beeson et al. | |
| 2006/0067078 | A1 | | 3/2006 | Beeson et al. | |
| 2006/0091412 | A1 | | 5/2006 | Wheatley et al. | |
| 2006/0091798 | A1 | | 5/2006 | Ouderkirk et al. | |
| 2006/0103782 | A1 | * | 5/2006 | Adachi et al. | 349/96 |
| 2006/0234408 | A1 | * | 10/2006 | Lee et al. | 438/22 |

(Continued)

FOREIGN PATENT DOCUMENTS

EP 1 577 958 9/2005

(Continued)

OTHER PUBLICATIONS

Zeng R. et al. "Optical Design of Large Area GaN-Based LEDs", Proceedings of SPIE, vol. 4996, pp. 105-112, Aug. 9, 1993.

(Continued)

*Primary Examiner* — Ha Tran T Nguyen
*Assistant Examiner* — Vongsavanh Sengdara
(74) *Attorney, Agent, or Firm* — Cozen O'Connor

(57) ABSTRACT

A radiation-emitting component (10) having a layer stack (1) which is based on a semiconductor material and which has an active layer sequence (4) for generating electromagnetic radiation, and a filter element (2) which is arranged after the active layer sequence (4) in the irradiation direction (A) and by means of which a first radiation component is transmitted, and a second radiation component is reflected into the layer stack (1), wherein the second radiation component is subjected to a deflection process or an absorption and emission process, and the deflected or emitted radiation impinges on the filter element (2).

22 Claims, 12 Drawing Sheets

U.S. PATENT DOCUMENTS

2008/0135739 A1* 6/2008 Kim et al. .................... 250/226

FOREIGN PATENT DOCUMENTS

| EP | 1 662 584 | 9/2005 |
|---|---|---|
| EP | 1577959 A2 | 9/2005 |
| EP | 1 622 584 | 5/2006 |
| JP | 2003-174195 | 6/2003 |
| JP | 2004-247411 | 9/2004 |
| KR | 2005-0005094 A | 1/2005 |
| KR | 2005-0021843 A | 3/2005 |
| WO | WO 97/36131 | 10/1997 |
| WO | WO 0138907 A1 | 5/2001 |
| WO | WO 2006/035388 A2 | 4/2006 |
| WO | WO 2006/035391 | 4/2006 |

OTHER PUBLICATIONS

I. Schnitzer et al., "30% external efficiency from surface textured, thin-film light-emitting diodes", Applied Physics Letters, vol. 63, No. 18, pp. 2174-2176, Aug. 9, 1993.

* cited by examiner

FIG 2C A-A

RADIATION EMITTING ELEMENT

RELATED APPLICATION

This patent application claims the priority of German patent application 10 2006 037 736.2 filed Aug. 11, 2006, the disclosure content of which is hereby incorporated by reference.

FIELD OF THE INVENTION

The invention relates to a radiation-emitting component.

BACKGROUND OF THE INVENTION

For many applications, the light from an LED must be input into an optical system which is arranged downstream. This optical system usually has a specific numerical aperture (NA), i.e. a maximum angle of incidence relative to the axis of the system. Light which is incident at relatively large angles with respect to the axis cannot be used in this optical system and in the most unfavorable case gives rise to scattered light and artifacts.

In addition, applications such as, for example, LCD back lighting with LEDs or LEDs as light sources in projectors frequently require polarized light. However, the emission from LEDs is based on spontaneous emission and is therefore non-polarized.

In general terms, it is desirable to implement LEDs with optical properties which exceed normal optical properties without the need to accept significantly decreased efficiency of the LEDs.

SUMMARY OF THE INVENTION

An object of the present invention is to provide a radiation-emitting component which supplies a comparatively high luminance in a desired spatial direction, with a desired polarization direction or wavelength.

This and other objects are attained in accordance with one aspect of the present invention directed to a radiation-emitting component that comprises a layer stack which is based on a semiconductor material and which comprises an active layer sequence for generating electromagnetic radiation, and a filter element which is arranged after the active layer sequence in the irradiation direction and by means of which a first radiation component is transmitted, and a second radiation component is reflected into the layer stack, wherein after reflection at the filter element the second radiation component is subjected to a deflection process or an absorption and emission process, and the deflected or emitted radiation impinges on the filter element again.

The deflection process is in particular a reflection process. It is conceivable, for example, that on a side of the layer stack lying opposite the filter element a reflection layer is arranged which reflects back the impinging radiation in the direction of the layer stack, preferably at a glancing angle which is different from the angle of incidence. In order to change the angular distribution it is possible to use, for example, a scattering layer which reflects the impinging radiation diffusely.

All the components described above are constructed as a type of light box. In such a light box a light beam passes around ideally long enough until it impinges on the exit surface at a suitable angle and/or with a suitable polarization direction and can exit the light box. In addition the light beam can be absorbed in the active layer sequence and be emitted with the direction, polarization or wavelength which is suitable for the exit ("photon recycling"). As a result the luminance can be increased. Light beams which do not exit when they first impinge therefore are not lost but rather are extracted after more than one impinging process.

The filter element here can be a spatial angle filter, a polarization filter or a color filter, that is to say it can act in a direction-selective fashion, polarization-selective fashion or wavelength-selective fashion.

Preferably, the first radiation component is composed of light beams which impinge on the exit face within a first spatial angle range, while the second radiation component is composed of light beams which impinge within a second spatial angle range which is different from the first spatial angle range and is preferably complementary thereto. Moreover, the first radiation component can have linearly polarized light beams with a first polarization direction, and the second radiation component can have linearly polarized light beams with a second polarization direction perpendicular to the first polarization direction. Finally, the first radiation component can have light beams with wavelengths which lie within a wavelength range which essentially does not overlap with a wavelength range for the light beams of the second radiation component.

According to one preferred variant, the filter element is a spatial angle filter. The spatial angle filter can be, for example, a dielectric bandpass filter or a photonic crystal or may comprise structural elements which have different shapes and which restrict the irradiation angle.

In particular, the filter element can have a planar layer which contains a material with a refractive index which is lower than the refractive index of the semiconductor material of the layer stack.

According to one preferred embodiment, the filter element has at least one planar layer which contains a radiation-transmissive material.

The following materials are preferably possible for the filter element or the at least one layer: silicon oxide, silicon nitride, silicon oxynitride, aluminum oxide, titanium oxide, tantalum oxide, a glass material or a TCO (transparent conductive oxide). TCOs are transparent conductive materials, generally metal oxides such as, for example, zinc oxide, tin oxide, cadmium oxide, titanium oxide, indium oxide or indium tin oxide (ITO). In addition to binary metal oxygen compounds such as, for example, $ZnO$, $SnO_2$ or $In_2O_3$, the group of TCOs also includes ternary metal oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. Furthermore, the TCOs do not necessarily correspond to a stoichiometric composition and can also be p-doped or n-doped.

A material which is suitable for controlled deposition is preferably used for the filter element, so that unevennesses, for example, which may adversely affect the optical effect of the filter element, are very largely prevented.

If the filter element is embodied as a dielectric bandpass filter, it comprises, according to one advantageous embodiment, at least two dielectric layers with different refractive indices. In particular, the bandpass filter can comprise a first layer which contains titanium nitride, and a second layer which contains a silicon oxide or titanium oxide.

The filter element which is embodied as a dielectric bandpass filter is preferably structured in such a way that the radiation distribution for beams which include small angles, that is to say preferably angles between 0° and approximately 40°, with a normal to the surface of the filter element, is located within a bandpass of the filter element. This results in these light beams being transmitted with a high degree of probability. The probability of light beams being reflected increases as a function of the increasing size of the angle which the light beams include with the normal to the surface.

The dielectric bandpass filter according to the invention does not have to be as precise and good, and therefore does not have to be as expensive as, for example, in the case of antireflection lens coatings. The dielectric filter can be applied to a thin glass or plastic chip and thus be integrated in component designs which are provided in any case. Alternatively, the dielectric filter can be applied directly to the layer stack.

One advantage of the dielectric bandpass filter is that light no longer exits at high angles. It is thus possible, for example, to implement a further bundling without a loss of luminance and efficiency by means of a simple collector lens at a relatively large distance from the LED, while diffuse emitters require optical systems for this which are more difficult to realize.

According to a further embodiment of the filter element, it has structural elements. The structural elements are preferably shaped in such a way that they permit spatial-angle-dependent filtering of radiation. For example, the structural elements can become narrower in the irradiation direction. The structural elements can have a conical, pyramid-like or prismatic shape or be constructed in the same way as an inverse CPC (compound parabolic concentrator). The structures are composed, for example, of elongate, "mountain-ridge-like" elements for bringing about a directional irradiation characteristic in just one direction. Generally, the structural elements can be elements which come to a point in the upward direction and have any desired shape of base area for directionality in all the spatial directions.

According to a further variant, the structural elements become wider in the irradiation direction. In this variant, an arrangement of elongate or circular, upwardly tapering structural elements which is as dense as possible is particularly suitable. In preferred embodiments, the base angle is, in particular, greater than 40°, preferably greater than 60°, and particularly preferably greater than 70°. The ratio between the upper and lower diameter determines the directionality and is in particular greater than 2, preferably greater than 4, and particularly preferably greater than 6 in preferred embodiments. The tapering structural elements can either be etched into the semiconductor material of the layer stack or be manufactured in a separate layer composed of another material which preferably has a refractive index which is as high as that of the semiconductor material. The surfaces between the tapering structural elements can be mirrored, as can the side walls of the structural elements.

According to one variant, the structural elements are therefore produced on the layer stack. This can be done, for example, by structuring the layer stack so that the structural elements are also formed from a semiconductor material, or by structuring a layer which is applied to the layer stack, or by the structured application of the structural elements so that the structural elements contain a material which is different from a semiconductor material, said material being, for example, a silicon oxynitride, silicon nitride, aluminum oxide, titanium oxide or tantalum oxide.

A further variant provides a separate filter element with prefabricated structural elements. In particular the filter element can be a film which has structural elements. Such a film can be a generally known brightness enhancement film (BEF) which comprises, for example, prismatic structures which are arranged in lines. Light which is input into the film from the underside can be partially transmitted and partially reflected. In this context, owing to the effect of the BEF, the transmitted radiation component is restricted in one spatial direction to a narrower angle of aperture than would be the case without BEF. By means of a crossed pair of BEFs, this effect can also be achieved for two spatial directions. Since the film materials absorb comparatively little, the non-transmitted radiation is reflected according to the law of the conservation of energy so that the film (or a crossed pair) therefore in total constitutes a filter which transmits beams in a narrow angle around the normal and reflects the rest of the radiation. It is possible, for example, in this way to restrict the radiation emitted from the component to an angle of approximately +/−25° in relation to the normal to the surface of the filter element.

Between the layer stack and the filter element which has structural elements, it is possible to arrange a radiation-transmissive layer which contains in particular glass, spin-on glass, epoxy resin, silicone, PMMA (polymethyl methacrylate), a transparent organic material, photoresist, silicon oxide or silicon oxynitride. In this context, materials such as silicon oxynitride, silicon nitride, silicon oxide, aluminum oxide, titanium oxide or tantalum oxide are particularly suitable for the structural elements.

In addition, there can be an air-filled intermediate space between the layer stack and the filter element. In this case the following materials are preferably used for the structural elements: glass, spin-on glass, epoxy resin, silicone, PMMA, transparent organic material, photoresist, silicon oxynitride, silicon nitride, silicon oxide, aluminum oxide, titanium oxide or tantalum oxide.

The size of the structural elements can vary greatly. The structural elements can take on sizes of approximately 100 nm, preferably larger than 1 µm, but can also extend over the entire size of the chip.

The structural elements are preferably arranged on the surface of the layer stack in a regular fashion. Furthermore, the structural elements are particularly preferably arranged in accordance with a two-dimensional grid.

According to one preferred embodiment, the filter element has a photonic crystal. The photonic crystal can serve as a spatial angle filter or as a polarization filter.

According to a further preferred variant of the invention, the filter element is a polarization filter. The effect of the filter element which is embodied as a polarization filter is preferably such that the first radiation component comprises linearly polarized light beams with a first polarization direction, and the second radiation component comprises linearly polarized light beams with a second polarization direction which is perpendicular to the first polarization direction.

The polarization filter therefore allows light to pass through with a first polarization direction, and all other light is reflected back into the chip. There it is at least partially absorbed in the active layer sequence and emitted again with a new polarization direction in accordance with the internal quantum efficiency. The absorption and re-emission of radiation in the active layer sequence is also referred to as "photon recycling". Light which is not absorbed can be reflected at the interface with a carrier substrate, or at the rear side of the substrate in the case of transparent carrier substrates. Thin-film LEDs with an integrated metal mirror are particularly advantageous for this. The reflected light passes again through the active layer sequence, where it is either absorbed or impinges again on the reflecting polarization filter. Given an internal quantum efficiency of 100%, in such an arrangement the light would be reflected, absorbed and re-emitted in the LED until it can exit the chip or the radiation-emitting component with the desired polarization direction.

According to one embodiment of the invention, the filter element contains at least one birefringent material. This is distinguished by the fact that it is optically anisotropic, which means that the optical properties are not the same in all spatial directions. The filter element therefore has different refractive indices for different polarization directions and spatial directions. As a result, light beams are split into two component beams with different spatial directions and polarization directions. Separating the two component beams produces the first and second radiation components.

According to a further embodiment of the invention, the filter element has at least one first birefringent layer with a first refractive index n1 and a second refractive index n and at least one second birefringent layer with a third refractive index n2 and the second refractive index n. The second layer is preferably arranged after the first layer in the irradiation direction. Thus in one of the component beams the refractive index varies when light passes through the two layers, while in the other component beam the refractive index remains constant. The component beam can be reflected by suitably selecting n1 and n2.

In one preferred variant the first and second layers have an optical thickness of λ/4. In this context it is possible to reduce the transmission of one of the component beams by, for example, destructive interference in the irradiation direction, while the other component beam for which no jump in refractive index occurs at the junction between the first and second layers passes through the filter element virtually unattenuated.

Such birefringent layers can be manufactured, for example, by applying tension to the layers. In particular, the layers can be pulled in a certain direction. The layers preferably contain a plastic material. The filter element is particularly preferably a plastic film, which has a sequence of birefringent layers with alternating refractive indices for a polarization direction and a spatial direction.

In addition, with the filter element according to the invention it is possible to achieve polarization-dependent filtering by virtue of the fact that the filter element has a metal grid. The metal grid is preferably composed of metal strips which run parallel to one edge of the layer stack. Light beams which have a polarization direction parallel to the metal strips are reflected, while light beams which have a polarization direction perpendicular to the metal strips are transmitted.

In this context, the layer stack can be structured in such a way that the metal strips extend on raised portions of the layer stack. The raised portions are conceived as scattering centers for increasing the exiting of radiation.

The metal strips are preferably arranged at a distance from one another which is smaller than the wavelength of the radiation produced in the active layer sequence. The width of the metal strips should constitute a fraction of this distance. Such small structures can be manufactured, for example, using lithographic techniques or an imprint method.

A reflective layer can be provided in all the known embodiments. In particular, the reflective layer can be arranged on a side of the active layer sequence lying opposite the filter element. For example the reflective layer can be applied to a carrier substrate. The reflective layer typically contains a metal.

In addition, in all the known embodiments a scattering layer can be provided. This can be arranged, for example, between the active layer sequence and the reflective layer or between the active layer sequence and the filter element. A roughened semiconductor surface, a semiconductor surface with a regular structure, for example with photonic crystal structures, or a layer with geometric structures, that is to say structures with sizes above the wavelength (for example microprisms), can be used as the scattering layer.

Furthermore, in all the described variants of the filter element, an optical element can be arranged downstream of the layer stack in the irradiation direction, with the filter element preferably being arranged on a radiation-transmitting surface of the optical element, that is to say the filter element can be located before or after the optical element in the irradiation direction. In particular, the optical element can be a reflector and/or concentrator, for example a CPC (compound parabolic concentrator), a CHC (compound hyperbolic concentrator) or CEC (compound elliptic concentrator).

In one advantageous embodiment, the light from the layer stack is input into the optical element, for example an optical concentrator. The concentrator is configured in such a way that the light is guided with as little loss as possible. A filter element which has the desired functionality is mounted at the output of the concentrator. For example, in order to increase the directionality it is possible to use a BEF, but under certain circumstances it is also possible to configure the concentrator itself in such a way that it has the desired directional effect and thus serves as a filter element.

If, on the other hand, it is desired to produce polarized light, a polarization filter can be mounted at the output of the concentrator. Furthermore it is possible to use, for example, optical grids, gaps or holographic elements. The filter element has to be constructed in such a way that it returns the non-transmitted light into the concentrator largely without loss. The concentrator in turn feeds the returned light with as little loss as possible to the LED or the layer stack, where it is input again into the optical element, here a concentrator, after passing through the active layer sequence and after reflection at the reflective layer at the rear.

A concentrator optical system can be advantageous for a polarization filter if it is arranged in front of the polarization filter, since said concentrator optical system concentrates the radiation at the output onto an angular range in which the polarization filter is particularly active.

Instead of the optical element, the filter element, for example the filter film, can also be provided as close as possible to the LED or the layer stack, so that the non-transmitted light is reflected virtually completely back to the LED or the layer stack.

According to one preferred variant, the optical element is a reflector which surrounds the LED chip and is terminated with the filter element at the exit end.

In particular, the layer stack is manufactured here using thin-film technology and is preferably distinguished by at least one of the following characteristic features:

a reflective layer is applied to or formed on a first main face—turned towards a carrier element—or a radiation-producing epitaxial layer sequence and said reflective layer reflects back at least part of the electromagnetic radiation produced in the epitaxial layer sequence back into said sequence;

the epitaxial layer sequence has a thickness in the region of 20 μm or less, in particular in the region of 10 μm; and the epitaxial layer sequence contains at least one semiconductor layer with at least one face, which has a mixing structure which ideally brings about an approximately ergodic distribution of the light in the epitaxial layer sequence, i.e. it has an as far as possible ergodic stochastic scattering behavior.

A basic principle of a thin-film LED chip is described, for example, in I. Schnitzer et al., Appl. Phys. Lett. 63 (16), 18 Oct. 1993, 2174-2176, the disclosure contents of which are in this regard incorporated herein by reference.

A thin-film LED chip is in a good approximation a Lambert surface emitter and is therefore particularly good for use in a headlight.

As already mentioned, all the described embodiments are based on the principle of the light box. Light beams which are not extracted can pass around in the light box and exit in a second or x-th pass. An LED chip with as little internal absorption as possible, as little exiting via the side surfaces as possible and with a highly reflective mirror underneath the active zone is advantageous here. Furthermore, a scattering mechanism in the LED chip which provides the light beams with new angles for the "second attempt" is important. All these properties are met, in particular, by thin-film LED chips. However, it is also conceivable to use other chips, for example TS-LEDs (transparent substrate LEDs).

The layer stack is advantageously mirrored at the side faces, since as a result the part of the light which exits through the side faces is reduced.

DETAILED DESCRIPTION OF THE DRAWINGS

Figure 1:
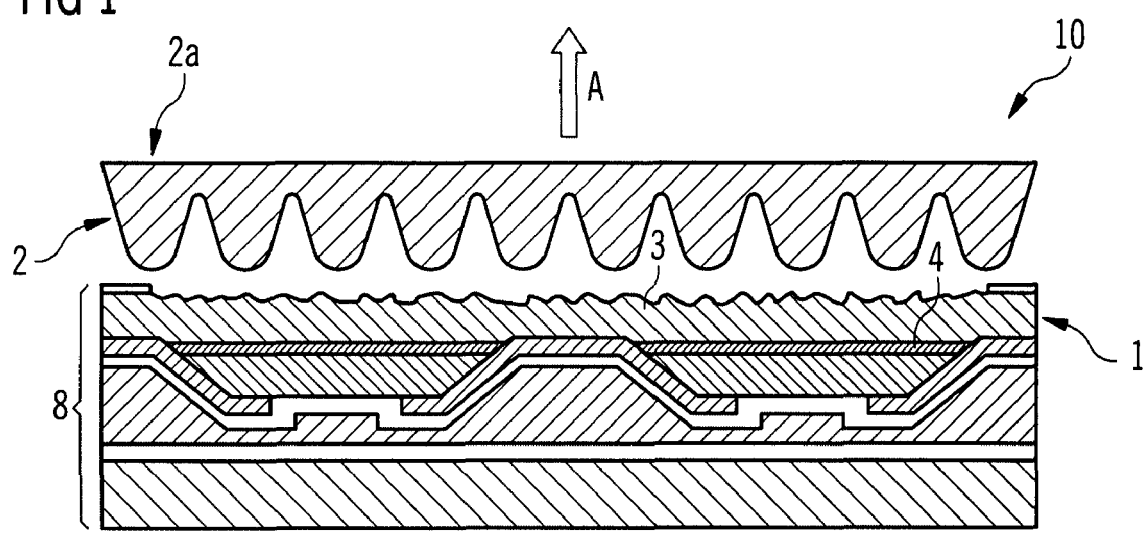
FIG. 1 is a schematic cross-sectional view of a first exemplary embodiment of a radiation-emitting component according to the invention, FIGS. 2a and 2b each are plan views of two different exemplary embodiments of a filter element according to the invention.

The radiation-emitting component 10 which is illustrated in FIG. 1 comprises a semiconductor chip 8 and a filter element 2. The semiconductor chip 8 comprises a layer stack 1 which is based on a semiconductor material and comprises an active layer sequence 4, and further elements (not designated in more detail), for example for making contact with the semiconductor chip 8. In particular, the semiconductor chip 8 is a thin-film chip. The active layer sequence 4 is provided for producing electromagnetic radiation and has, in the simplest case, a p-doped layer and an n-doped layer. The filter element 2 is arranged after the active layer sequence 4 in the irradiation direction A.

The filter element 2 can be applied directly to the layer stack 1. For example, the filter element 2 can be prefabricated and already have structural elements 2a. The prefabricated filter element 2 can thus be bonded onto the layer stack 1. In addition, the filter element 2 can be arranged spaced apart from the layer stack 1 so that, for example, there is an air gap between the layer stack 1 and the filter element 2.

A first radiation component, which impinges on the filter element 2 at an angle near to the axis with respect to the irradiation direction A, is transmitted by means of the filter element 2, while a second radiation component, which impinges at a flat angle, is thrown back to the chip surface 3. There, the radiation is largely input into the layer stack 1. The chip surface 3 can be structured, for example roughened, so that part of the radiation is scattered back. In addition, the active layer sequence 4 absorbs radiation and in turn emits radiation in accordance with its internal efficiency.

All of these mechanisms lead to a change in the angle of the reflected-back light beams relative to the irradiation direction A, so that when the radiation subsequently impinges on the filter element 2 a further radiation component can pass through the filter element 2.

The filter element 2 preferably contains a material which is transparent to the radiation produced by the active layer sequence 4 and whose refractive index is smaller than the refractive index of the material used for the active layer sequence 4. For example, the refractive index is 1.5.

In the illustrated example, the irradiation profile can be restricted in the x and y directions (z direction=optical axis=irradiation direction A) by constructing the filter element 2 in the form of an array of inverse CPCs (compound parabolic concentrators). The filter element 2 which is illustrated in FIG. 1 is therefore a spatial angle filter.

Figure 2A:
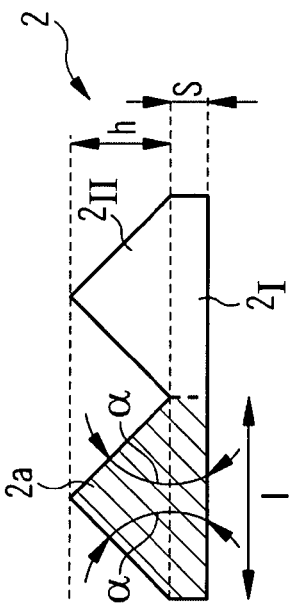
FIG. 2c shows a cross-sectional view of the two exemplary embodiments of the filter element which are shown in FIGS. 2a and 2b.
Figure 2A:
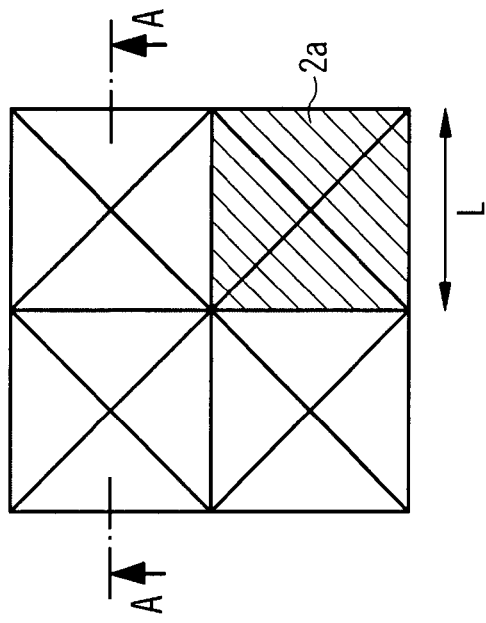
Figure 2B:
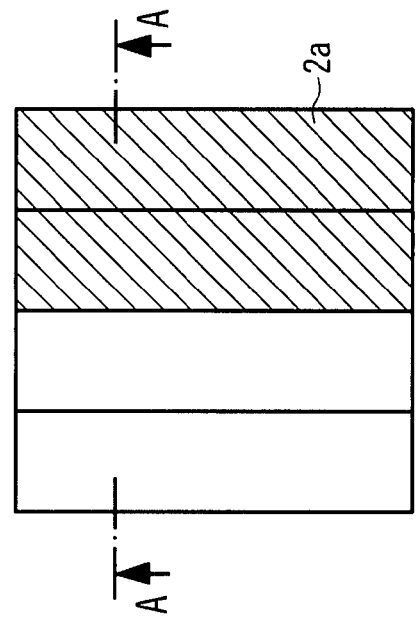

In FIGS. 2a and 2b, further structural elements 2a which are suitable for a filter element according to the invention are illustrated in a plan view, and in FIG. 2c they are illustrated in cross section along the line AA. In FIG. 2a quadratic pyramid-shaped structural elements 2a are illustrated, and in FIG. 2b elongate, mountain-ridge-shaped or prismatic structural elements 2a are illustrated. As is apparent from FIG. 2c, the structural elements 2a have an edge length I which can be at a minimum a few 100 nm but also can be more than 1 μm, and in an extreme case can correspond to the length of the edge of the chip. In addition, a base angle α of the structural elements 2a takes on, in particular, values between 30° and 60°, preferably between 40° and 50°.

The filter element 2 is composed of a first component layer $2_I$ and a second component layer $2_{II}$, with the second component layer $2_{II}$ being structured. The refractive index n2 of the second component layer $2_{II}$ is preferably greater than or equal to the refractive index n1 of the first component layer $2_I$.

In this context, the following materials are possible for the first component layer $2_I$: glass/spin-on glass, epoxy resin, silicone, PMMA, a transparent organic material, photoresist, a silicon oxide, a silicon oxynitride. For the second component layer $2_{II}$ it is then possible to use the following materials: a silicon nitride, silicon oxynitride, aluminum oxide, titanium oxide, tantalum oxide.

If the first component layer $2_I$ is composed of air, the following materials are suitable for the second component layer $2_{II}$: glass/spin-on glass, epoxy resin, silicone, PMMA, transparent organic material, photoresist, silicon oxide, silicon oxynitride, silicon nitride, aluminum oxide, titanium oxide, tantalum oxide.

The filter element 2 can already be applied in a prefabricated form to the layer stack. For example, the BEF already mentioned has a structure as illustrated in FIG. 2c and can be applied directly to the layer stack. Alternatively, the first component layer $2_I$ can be applied to the layer stack first, and the unstructured second component layer $2_{II}$ can then be applied, said second component layer $2_{II}$ containing, for example, BCB (benzocyclobutene) and being able to be structured by stamping, for example, so that the structural elements 2a are formed.

Figure 3:
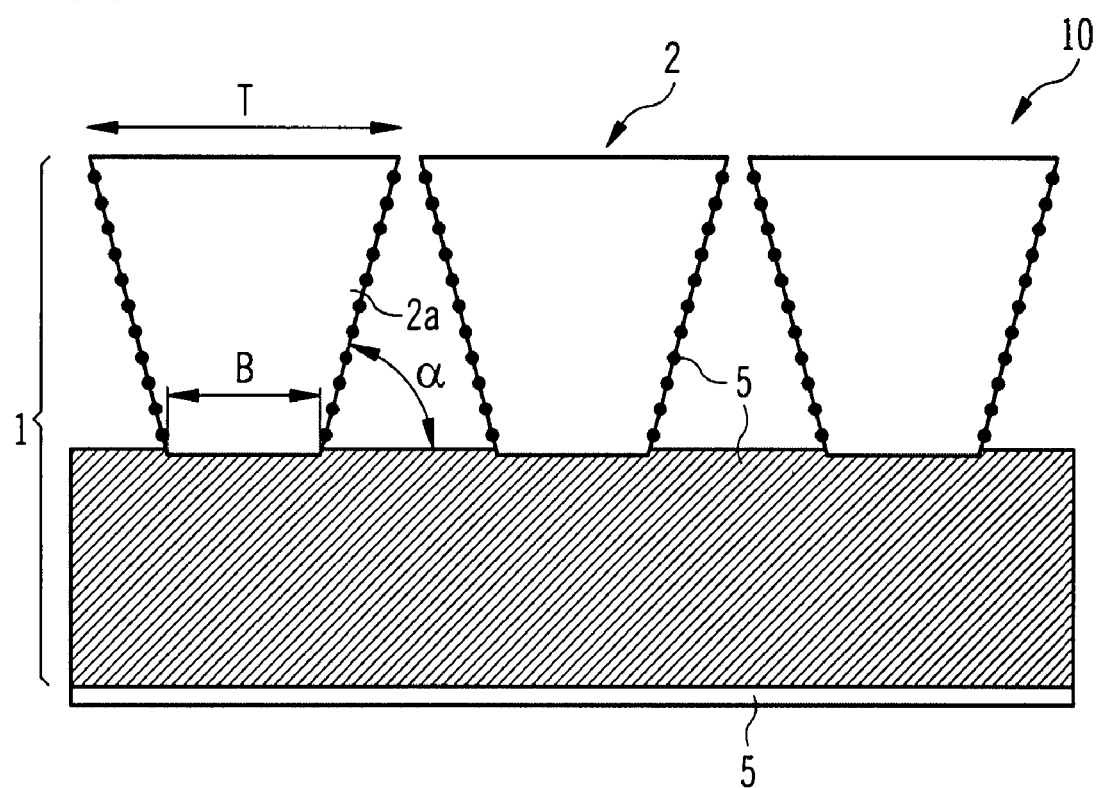
FIG. 3 is a cross-sectional view of a second exemplary embodiment of a radiation-emitting component according to the invention.

The filter element 2 which is shown in FIG. 3 has structural elements 2a in the form of tapers. The structural elements 2a become wider toward the top, that is to say an upper diameter T of the structural elements 2a is greater than a lower diameter B. In particular, the ratio T:B determines the directionality of the filter element 2 and is preferably >2, particularly preferably >4, more particularly preferably >6. Preferred values for the base angle α are >40°, in particular >60°, particularly preferably >70°.

The structural elements 2a are etched out of the layer stack 1, that is to say the structural elements 2a contain a semiconductor material. The structural elements 2a are provided with a reflective layer 5 on side faces. In addition, the layer stack 5 has a reflective layer on the rear side. A further reflective layer 5 is located between the individual structural elements 2a.

The structural elements 2a can be formed from another material, such as glass/spin-on glass, epoxy resin, silicone, PMMA, a transparent organic material, photo resist, silicon oxide, silicon oxynitride, silicon nitride, aluminum oxide, titanium oxide or tantalum oxide. Preferably, a material with a high refractive index, that is to say one in the region of the semiconductor material is selected. For example the structural elements 2a are arranged on a layer of the layer stack which is in particular a scattering layer.

The structural elements 2a can have a lower diameter B which is at minimum a few 100 nm but can also be more than 1 μm, and in an extreme case can correspond to the length of an edge of the chip.

Figure 4:
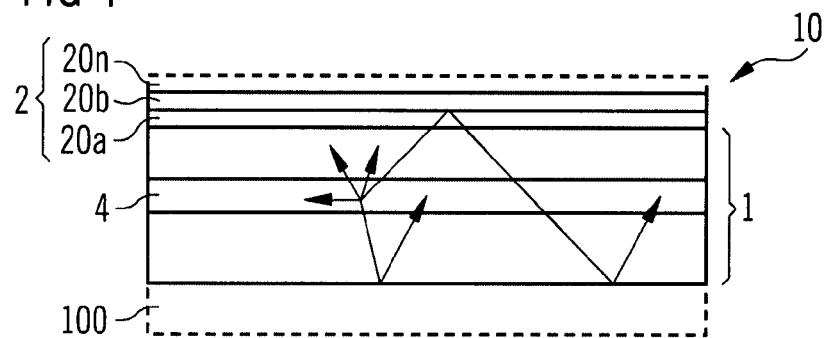
FIG. 4 is a cross-sectional view of a third exemplary embodiment of a radiation-emitting component according to the invention.

While in the case of a filter element illustrated in FIGS. 1 to 3 the spatial-angle-dependent filtering is carried out by means of suitably shaped structural elements, FIG. 4 shows a component 10 with a filter element 2 in which the spatial-angle-dependent filtering is carried out by utilizing interference effects.

Figure 6:
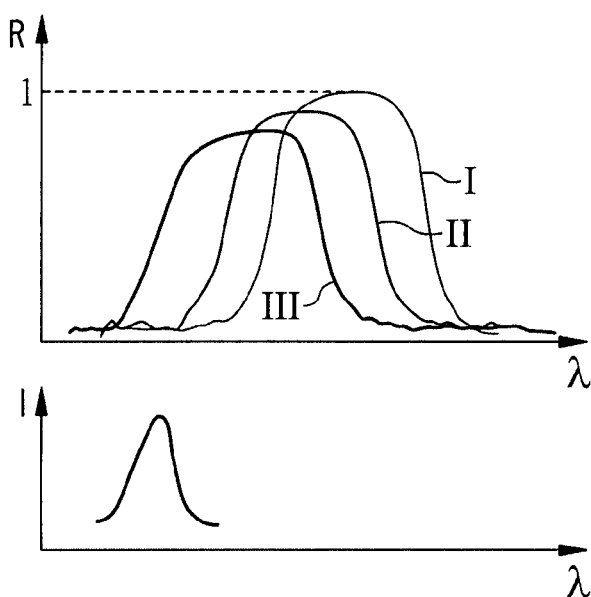
FIG. 6 is a first diagram showing reflection spectrums of a spatial angle filter according to the invention, and a second diagram showing the spectral distribution of the radiation which is generated.

The filter element 2 has at least a first dielectric layer 20a and at least a second dielectric layer 20b. The dashed layer 20n indicates that the filter element 2 can have a multiplicity of n layers. The two layers 20a and 20b contain materials with different refractive indices. The semiconductor material of the layer stack 1 preferably has a larger refractive index than the dielectric layers 20a and 20b. In particular the first dielectric layer 20a can contain titanium nitride, and the second dielectric layer 20b can contain silicon oxide. A reflection spectrum which is characteristic of the filter element 2 is illustrated in FIG. 6 and will be explained in more detail below.

While the filter element 2 is located on the front side of the radiation-emitting component 10, a reflective layer and/or a carrier can be arranged on the rear side, and this is indicated by the dashed element 100. Such an element 100 is provided for deflecting again in the direction of the front side the impinging radiation which is composed at least partially of the radiation component which is reflected back by the filter element 2, said deflection occurring preferably at a different angle so that the light beam can exit the component.

Figure 5:
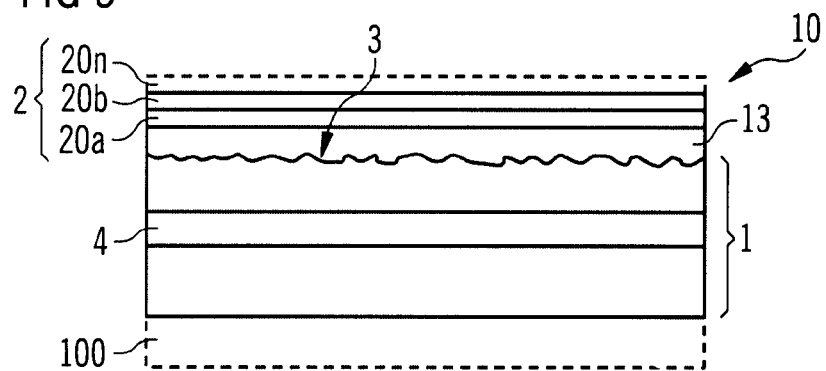
FIG. 5 is a schematic cross-sectional view of a fourth exemplary embodiment of a radiation-emitting component according to the invention.

FIG. 5 shows a radiation-emitting component 10 which mainly differs from the component illustrated in FIG. 4 by virtue of the fact that it has a layer stack 1 with a roughened surface 3. The roughened surface 3 has a multiplicity of scattering centers which permit the angular distribution to be changed. The exiting of the radiation can advantageously be increased by this means.

Since the filter element 2 which is configured as a dielectric bandpass filter is intended to have layers with a homogeneous layer thickness, the roughened surface 3 is unsuitable for directly applying the filter element 2. Therefore a planarization layer 13, which forms a planar underlying surface for the filter element 2, is arranged on the layer stack 1, the planarization layer 13 preferably contains a radiation-transmissive material, for example silicon oxide or spin-on glass.

The refractive index of the layer stack 1 preferably decreases up to the filter element 2.

It is to be noted that the filter elements described in conjunction with FIGS. 4 and 5 can, for example, also be applied to a chip and can be attached to a housing (not illustrated) of the component by means of this chip.

FIG. 6 contains an upper diagram in which reflection spectrums for the angles 0°, 20° and 40° are outlined (cf. curves I to III, abscissa: wavelength λ, ordinate: degree of reflection R), and a lower diagram with the spectrum (abscissa: wavelength λ, ordinate: intensity I) of the radiation produced in the active layer sequence. These diagrams apply both to the component illustrated in FIG. 4 and to that illustrated in FIG. 5.

As is apparent from the two diagrams, the spectral distribution of the radiation which is produced is located at the short wave length edge of the reflection spectrums of the filter element. Light beams which include an angle of smaller than or equal to 40° with the normal to the surface of the filter element therefore lie within a pass band of the filter element. These light beams are essentially transmitted by the filter element, while light beams that enclose an angle greater than 40° with the normal to the surface of the filter element are essentially reflected.

Figure 7A:
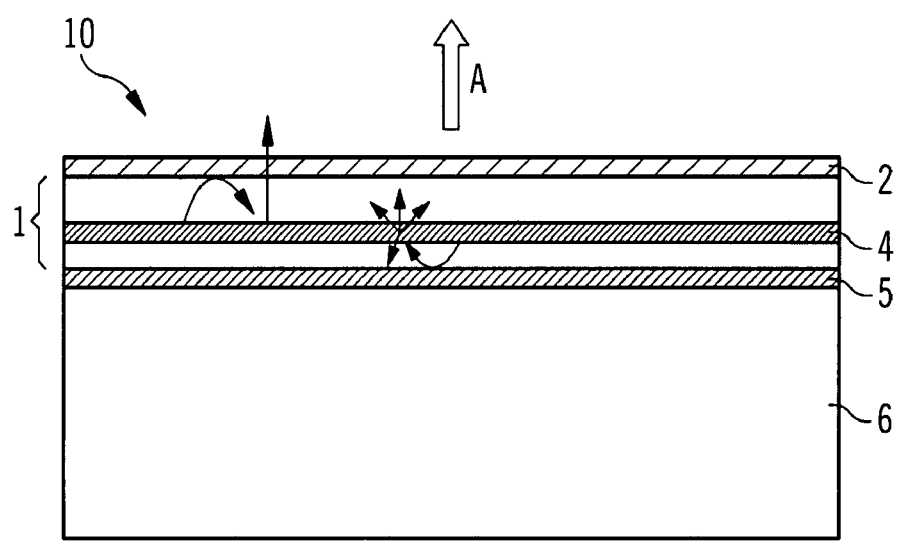
FIG. 7a is a schematic cross-sectional view of a fifth exemplary embodiment of a radiation-emitting component according to the invention.

The radiation-emitting component 10 illustrated in FIG. 7a comprises a carrier substrate 6 and a layer stack 1 which is arranged on it. The layer stack 1 is bounded by the filter element 2 on a radiation exit side of the component 10. The filter element 2 is a polarization filter in this exemplary embodiment.

The filter element 2 allows light to pass with a special polarization direction and all other light is reflected back into the layer stack 1. The light which is reflected back can be partially absorbed in the active layer sequence 4 and, depending on the internal quantum efficiency, emitted again with a new polarization direction. Light which is not absorbed can be reflected at a reflection layer 5 which is arranged between the layer stack 1 and the carrier substrate 6. A thin-film LED with an integrated metal mirror as reflective layer 5 is particularly advantageous for this. The reflected light passes again through the active layer sequence 4 where it is either absorbed and, if appropriate, re-emitted or impinges on the filter element 2 again.

Figure 7B:
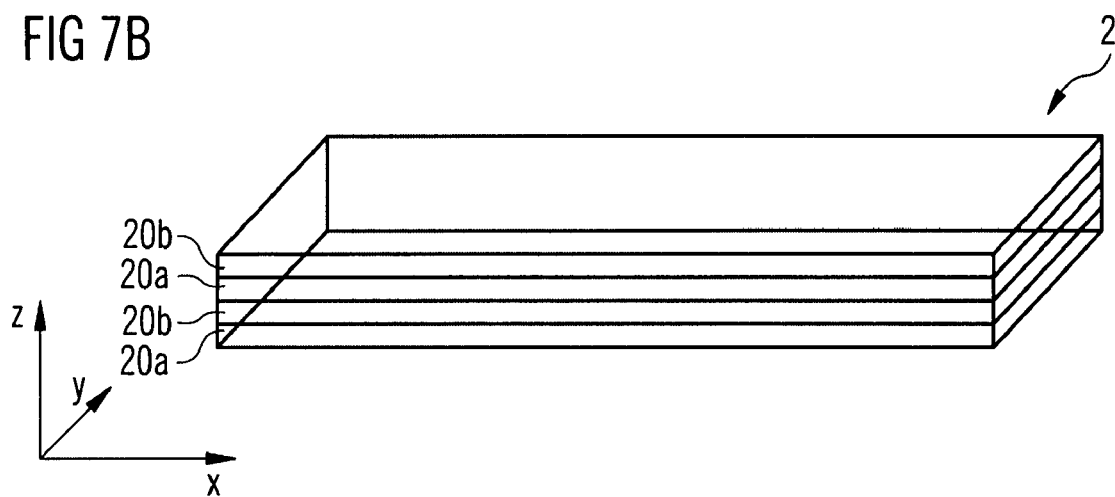
FIG. 7b is a perspective view of the filter element shown in FIG. 7a, FIGS. 8a to 8d are a plan view of various exemplary embodiments of a filter element.

A filter element 2 which is suitable as a polarization filter is illustrated in a perspective view in FIG. 7b. The filter element 2 comprises a plurality of birefringent layers 20a and 20b. The layers 20a have a first refractive index n1 in the x direction and a second refractive index n in the y direction. The layers 20b have a third refractive index n2 in the. x direction, and the second refractive index n in the y direction. The refractive index in the x direction thus alternates over the layers 20a and 20b, while it remains constant in the y direction. Light beams whose polarization direction is parallel to the x direction can therefore be reflected at the junction between the various layers 20a and 20b and transmitted back into the layer stack. In particular, the layers 20a and 20b have an optical thickness of λ/4. In addition, the light beams interfere with the polarization direction parallel to the x direction in a preferably destructive fashion in the transmission direction and constructive fashion in the reflective direction. Light beams whose polarization direction is parallel to the y direction pass through a medium which is optically homogeneous, and therefore pass through the filter element essentially without deflection. The radiation-emitting component 10 thus emits radiation with a polarization direction parallel to the y direction.

Further possibilities for the configuration of the filter element as polarization filter are described below with reference to FIGS. 8a to 8e and 9a to 9c. All these exemplary embodiments have in common the fact that the polarization filter is embodied as a metal grid. In particular, the metal grid is composed of metal strips 200a which run parallel to an edge of the layer stack.

The metal strips 200a preferably follow one another at a distance which is smaller than the wavelength of the radiation. The width of the metal strips 200a is a fraction of the distance. Metal or metal compounds, in particular Au, Ag, Al or AuZn, can be used for the metal grid. Light beams with a polarization direction parallel to the metal strips 200a are reflected, while light beams with a polarization direction are transmitted perpendicular to the metal strips 200a.

In addition to the function as a polarization filter, the metal grid can advantageously serve as a contact grid and can ensure homogeneous injection of current into the layer stack. The metal grid can for this purpose be connected to a bonding pad 17 by means of contact arms 18. The contact arms 18 are typically wider than the metal strips 200a. By using the metal grid for injecting current it is advantageously possible to make a saving in terms of further contact arms so that the effective emission surface is made larger.

Figure 8A:
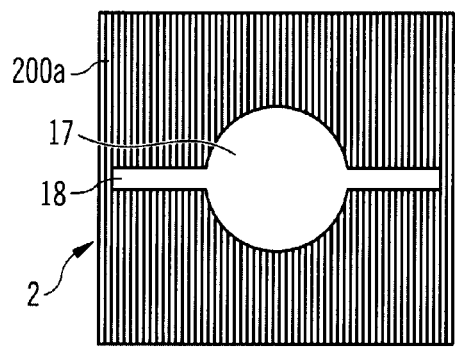
FIG. 8e is a cross-sectional view of a sixth exemplary embodiment of a radiation-emitting component according to the invention with a filter element as per FIG. 8a or FIG. 8d.
Figure 8B:
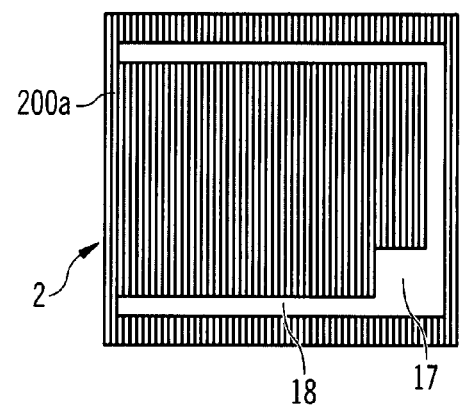
Figure 8C:
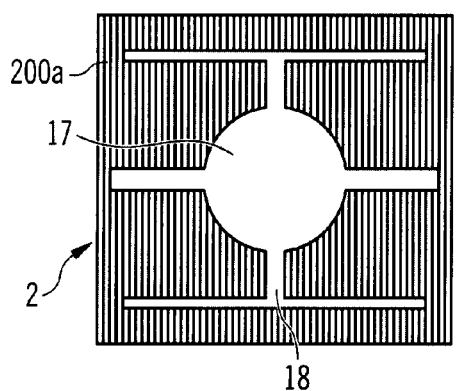
Figure 8D:
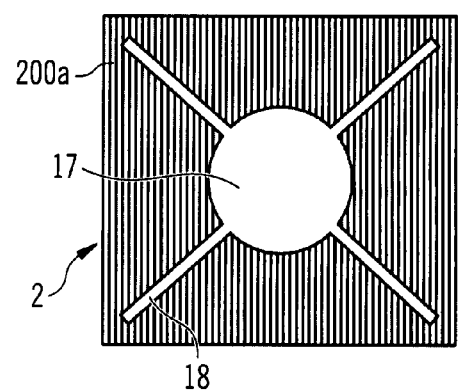

It is apparent from FIGS. 8a, 8c and 8d, each of which show a plan view of the component, that the bonding pad 17 can be arranged centrally on the emission surface of the component. The contact arms 18 lead outward from the bonding pad 17 to the edges of the component and thus supply the decentralized areas with current. Alternatively, the bonding pad 17, can, as illustrated in FIG. 8b, be arranged in a corner of the chip. This has the advantage that radiation can be emitted in the center of the chip.

Figure 8E:
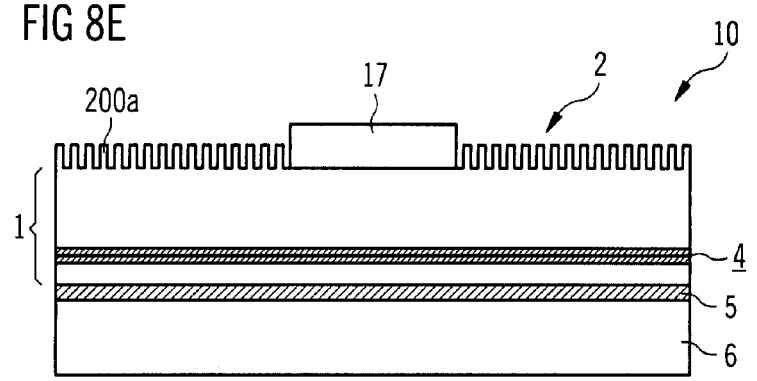

FIG. 8e shows a cross section of the component as per FIGS. 8a and 8d. The component 10 is manufactured using thin film technology, that is to say the layer stack 1 is separated from the growth substrate. The layer stack 1 is instead arranged on a carrier substrate 6 and provided at the rear with a reflective layer 5. The radiation component which is reflected back by the filter element 2 can be deflected in the direction of the exit side by means of the reflective layer 5. In order to provide the impinging light beams with a new polarization direction and thus increase the probability of exiting, the reflective layer 5 can, for example, have unevennesses. Alternatively, the layer stack 1 can be roughened at the rear in which case the unevennesses can be evened out by means of a planarization layer (not illustrated) between the layer stack 1 and the reflective layer 5. The planarization layer preferably contains a radiation-transmissive material, for example a TCO.

Figure 9A:
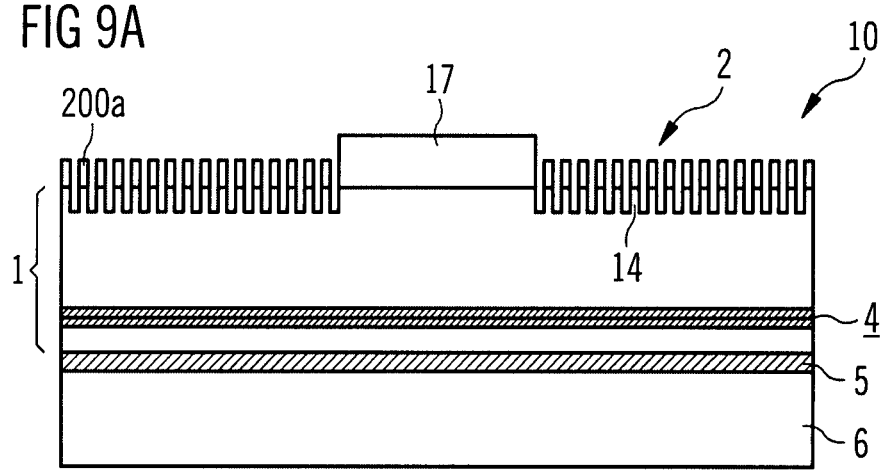
FIG. 9a is a schematic cross-sectional view of a seventh exemplary embodiment of a radiation-emitting component according to the invention.

A further variant is illustrated in FIG. 9a. The layer stack 1 is structured on the front side so that the component 10 has, in contrast to the component illustrated in FIG. 8e, an internal scattering mechanism on the front side instead of on the rear side. The structuring is configured in accordance with the metal grid so that the metal strips 200a of the metal grid extend on raised portions 14. More structural details of this arrangement are provided below in relation to FIG. 9c. In this variant it is possible to dispense with a planarization layer. In addition, the reflective layer 5 can be made planar so that a comparatively good reflective effect can be achieved. Raised portions 14 constitute scattering centers since their width, like that of metal strips 200a, is far smaller than the wavelength.

Figure 9B:
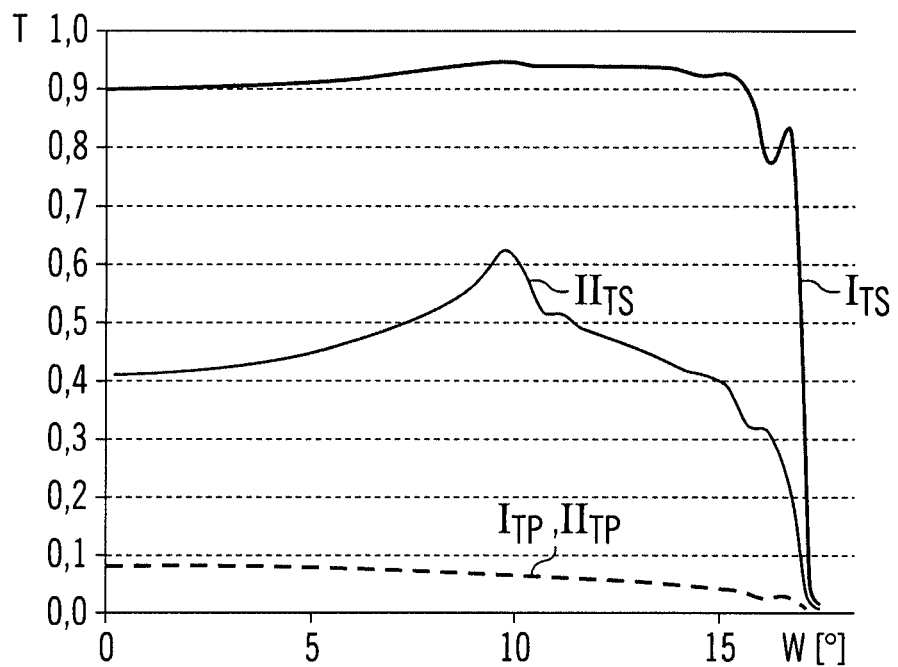
FIG. 9b is a diagram which illustrates inter alia transmission spectrums of the component which is shown in FIG. 9a, and FIG. 9c shows a detail of the filter element shown in FIG. 9a, FIG. 10 is a schematic cross-sectional view of an eighth exemplary embodiment of a radiation-emitting component according to the invention.

FIG. 9b illustrates simulated transmission spectrums for a component according to FIG. 9a (cf. curve $I_{TS}$, $I_{TP}$) and a component with an unstructured surface, with the metal strips 200a not extending on raised portions (cf. curve $II_{TS}$, $II_{TP}$).

"TS" stands for the polarization direction perpendicular to the metal strips 200a. "TP" stands for the polarization direction parallel to the metal strips 200a.

The ordinate indicates the degree of transmission T. The abscissa indicates the angle W between the normal to the surface of the filter element and the incident light beam. As is apparent from the diagram in FIG. 9b in the case of radiation which has parallel polarization there is no difference whether the surface is structured or unstructured. In both cases, the radiation is reflected with a high degree of probability. However, in the case of the radiation with perpendicular polarization the degree of transmission T can be increased decisively if the surface is provided with structuring.

Figure 9C:
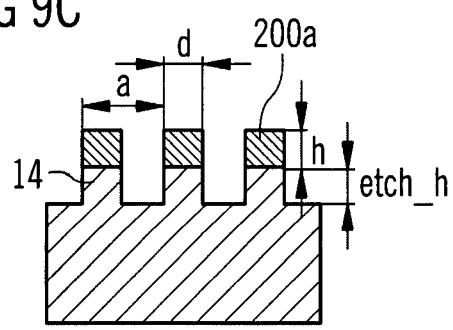

FIG. 9c illustrates the raised portions 14 with the applied metal strips 200a in an enlarged form. Raised portions 14 form the uppermost portion of layer stack 1. The metal strips 200a have, like the raised portions 14, the width d. The distance between the metal strips 200a, like that between the elevations 14, is indicated by a-d. The height of the metal strips 200a is designated by h and the height of the raised portions 14 is designated by etch_h. Raised portions 14 can be formed by the same etching step (see below) used to form metal strips 200a. The etching is carried out deeper so that it extends down to the layer stack.

The following values have been used to simulate the transmission spectrums: a=160 nm, h=80 nm, d=80 nm and etch_h=180 nm.

Two different methods are possible for manufacturing the metal grid according to the described variants: either the metal grid is applied in structured form by a mask arranged on the layer stack or is produced subsequently by structuring a continuous metal layer. For example, the structuring can be carried out by means of lithographic methods (electron beam lithography or nano imprint lithography). The metal grid is manufactured, in particular, by sputtering or vaporization methods.

In all the filter elements described here, either the thickness of the filter element is small compared to the lateral extent of the component or the faces of the filter element are mirrored so that the radiation which is produced can be used efficiently.

FIGS. 10 to 15 are intended to illustrate various arrangement possibilities for the reflective layer 5, the scattering layer 11 and the filter element 2. Of course, the filter element 2 can be embodied here as a spatial angle filter or polarization filter in accordance with one of the variants described above.

Figure 10:
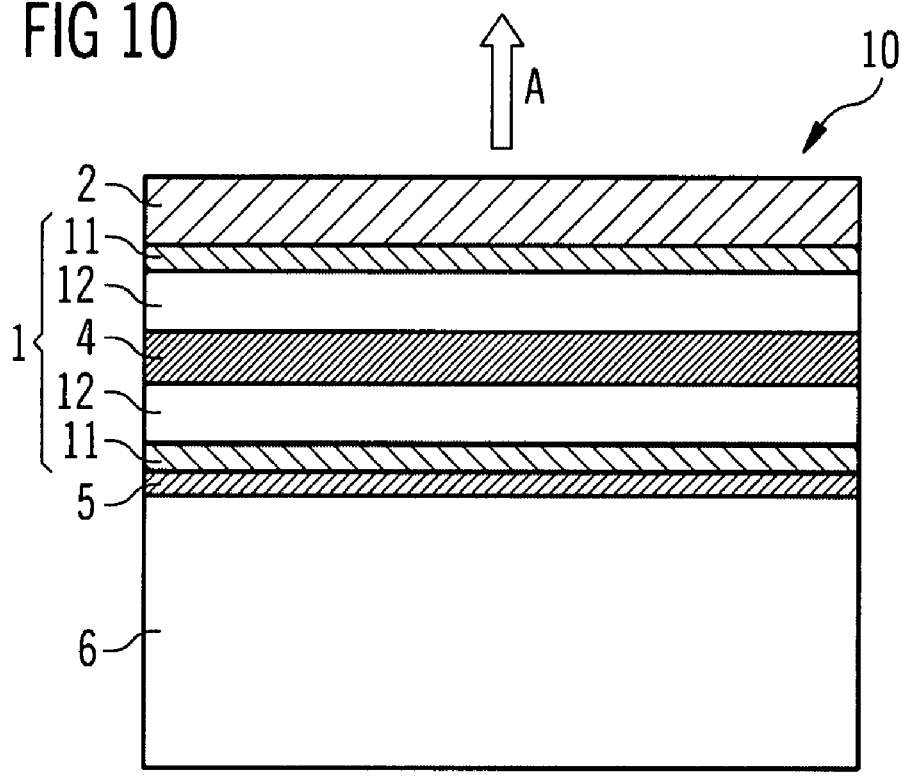

The radiation-emitting component 10 illustrated in FIG. 10 comprises a carrier substrate 6 after which, in the irradiation direction A, a reflective layer 5, a first scattering layer 11, a doped layer 12, for example a confinement layer, an active layer sequence 4, a further doped layer 12, for example a confinement layer, a second scattering layer 11 and a filter element 2, are arranged. The first scattering layer 11, the doped layer 12, the active layer sequence 4, the further doped layer 12 and the second scattering layer 11 are preferably part of the layer stack 1 and contain a semiconductor material.

Figure 11:
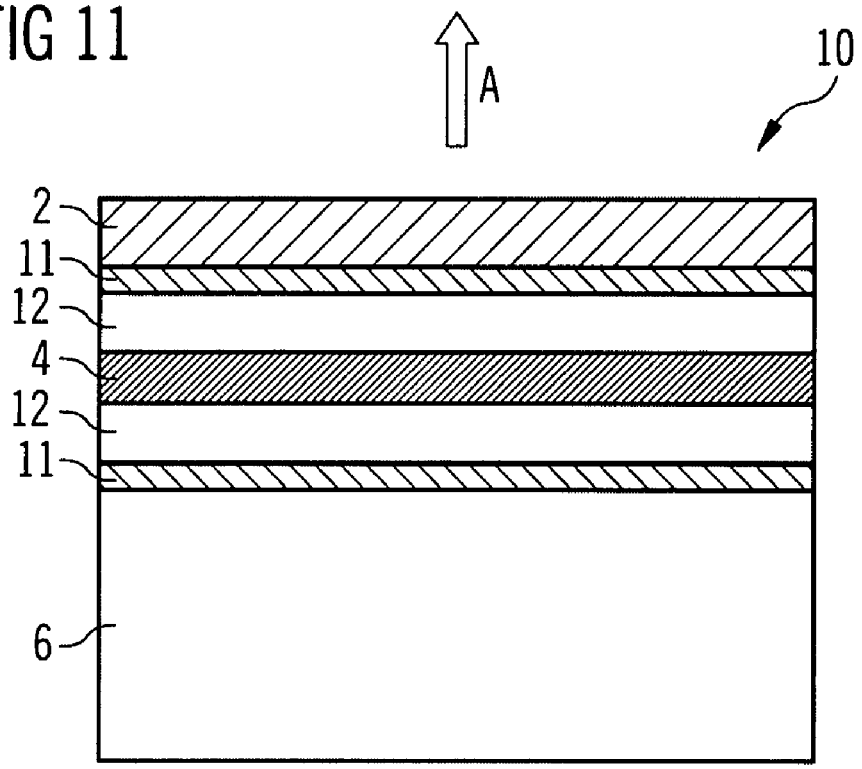
FIG. 11 is a schematic cross-sectional view of a ninth exemplary embodiment of a radiation-emitting component according to the invention.

The radiation-emitting component 10 which is illustrated in FIG. 11 comprises, with the exception of the reflective layer 5, layers which correspond to the radiation-emitting component 10 illustrated in FIG. 10. In this exemplary embodiment, the carrier substrate 6 has a refractive index which is significantly different from the layers lying above it. In particular, the refractive index is smaller so that incident radiation can be totally reflected. In this way it is possible to dispense with a reflective layer.

Figure 12:
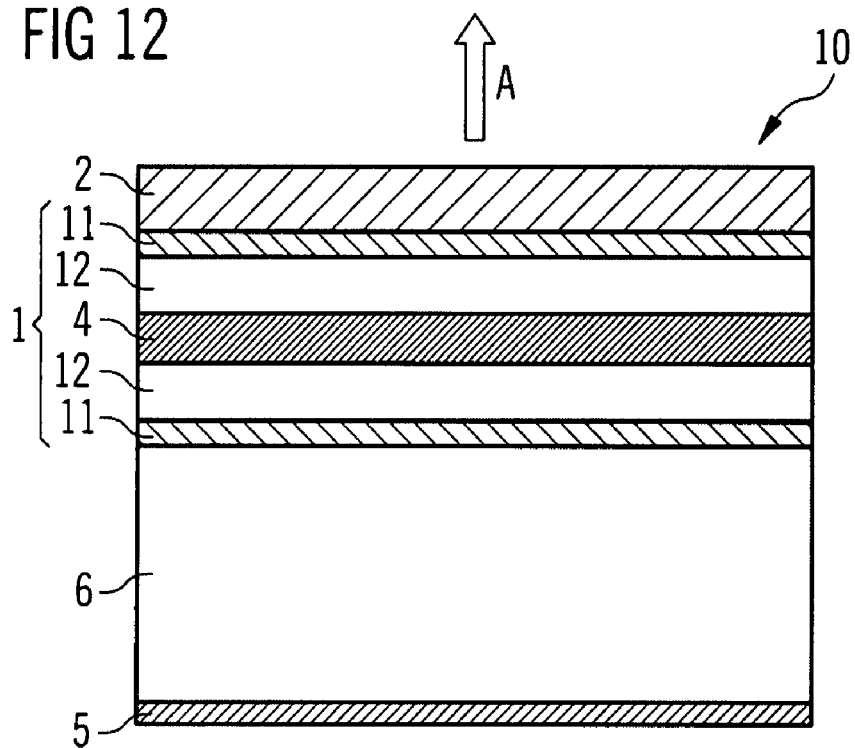
FIG. 12 is a schematic cross-sectional view of a tenth exemplary embodiment of a radiation-emitting component according to the invention.

The structure of the radiation-emitting component 10 shown in FIG. 12 corresponds largely to that in FIG. 10. The carrier substrate 6 is different, said carrier substrate 6 being transparent and containing sapphire, for example. A reflective layer 5 is arranged on a side of the carrier substrate 6 facing away from the layer stack 1. The radiation which is transmitted through the carrier substrate 6 can therefore be reflected back into the layer stack 1 by means of the reflective layer 5.

Figure 13:
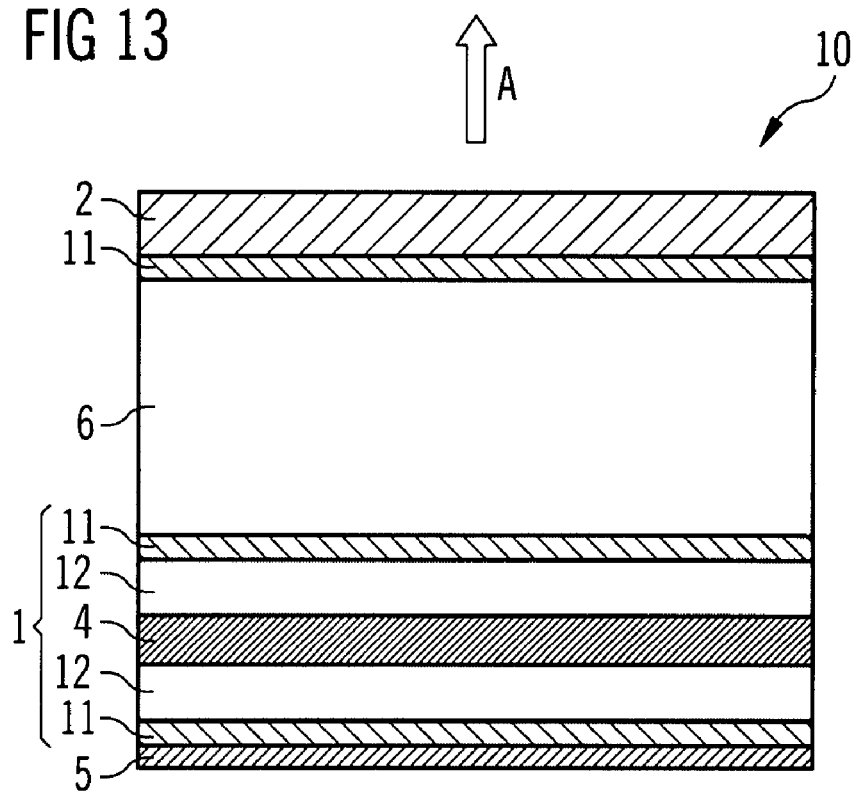
FIG. 13 is a schematic cross-sectional view of an eleventh exemplary embodiment of a radiation-emitting component according to the invention.

A radiation-emitting component 10 with a flip chip arrangement is illustrated in FIG. 13. A reflective layer 5 is arranged on a side of the layer stack 1 facing away from the carrier substrate 6. In addition a scattering layer 11 and the filter element 2 are arranged on a side of the carrier substrate 6 facing away from the layer stack 1. The carrier substrate 6 is preferably transmissive here to the radiation produced by the active layer sequence 4. For example, the carrier substrate 6 contains sapphire. An advantage with this arrangement is that the growth substrate, which is at the same time the carrier substrate 6 does not have to be separated from the layer stack 1. Nevertheless, the heat produced during operation owing to the flip chip arrangement can be taken at the location where it is produced, specifically near to the active layer sequence 4. Heat can be satisfactorily conducted away by means of the reflective layer 5.

Figure 14:
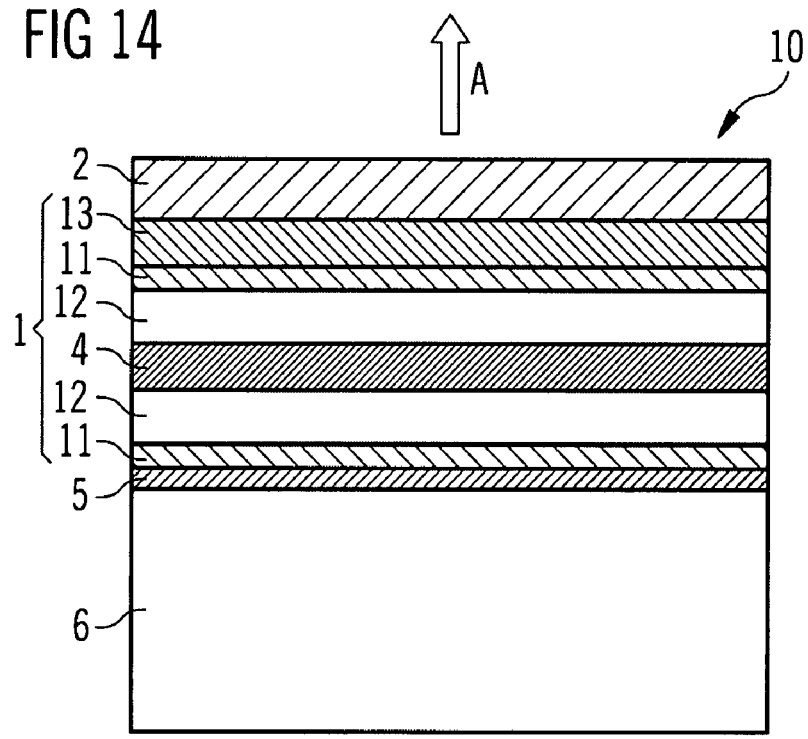
FIG. 14 is a schematic cross-sectional view of a twelfth exemplary embodiment of a radiation-emitting component according to the invention.

The radiation-emitting component 10 which is illustrated in FIG. 14 comprises a carrier substrate 6 after which, in the irradiation direction A, a reflective layer 5, a first scattering layer 11, a doped layer 12, for example a confinement layer, an active layer sequence 4 for producing electromagnetic radiation, a further doped layer 12, for example a confinement layer, a second scattering layer 11, a planarization layer 13 and a filter element 2 are arranged. The scattering layers 11 are optional components. This also applies to the planarization layer 13 which can in particular be eliminated if the layer underneath it is planar.

Figure 15:
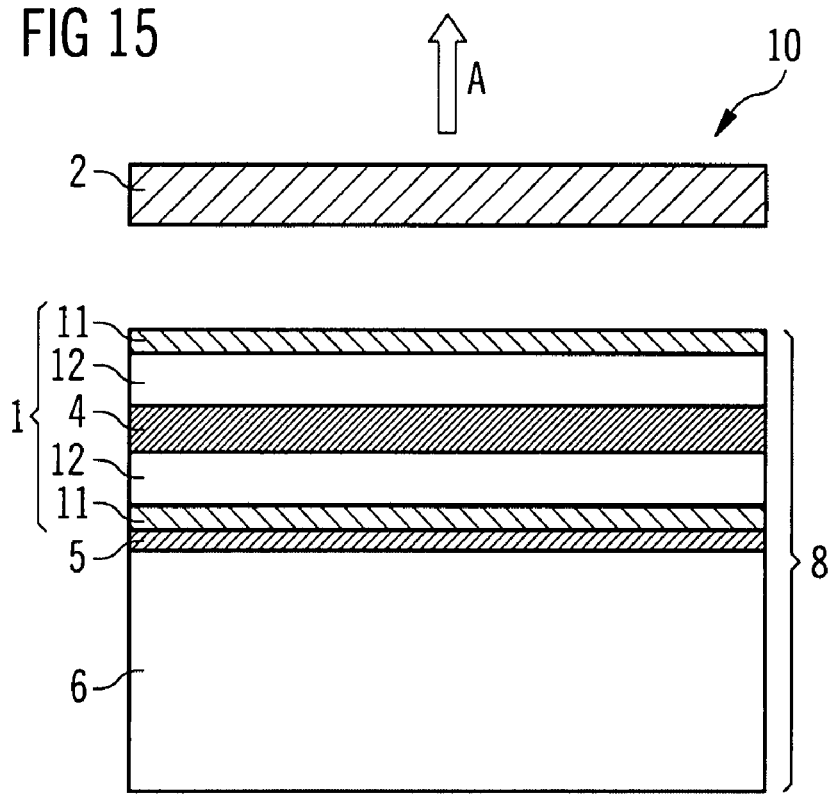
FIG. 15 is a schematic cross-sectional view of a thirteenth exemplary embodiment of a radiation-emitting component according to the invention.

The filter element 2 illustrated in FIG. 15 is mounted as a separate external element above the semiconductor chip 8 or layer stack 1. It is conceivable for optical elements to be arranged before the filter element 2 in the irradiation direction A (cf. FIGS. 17 to 20).

It is to be noted that the scattering layers 11 illustrated in relation to FIGS. 10 to 15 are not necessary but rather optional components.

Figure 16:
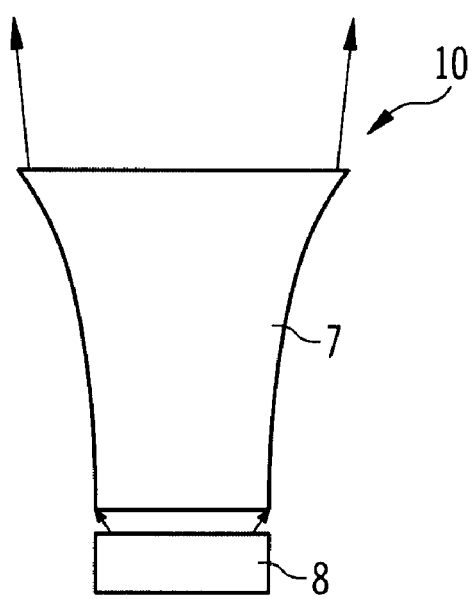
FIG. 16 is a schematic cross-sectional view of a fourteenth exemplary embodiment of a radiation-emitting component according to the invention.

FIG. 16 illustrates a radiation-emitting component 10 which comprises a thin film semiconductor chip 8 and an optical element 7 which serves as a filter element. The optical element 7 is in this case a mirrored concentrator which is arranged near to the chip. In order to keep losses small, the distance between a radiation input face of the optical element 7 and the chip surface should be smaller than 10% of the length of an edge of the chip and the acceptance angle of the optical element 7 should be as close as possible to +/−90°. In addition it could be appropriate to mirror the side faces of the thin film semiconductor chip 8.

Figure 17:
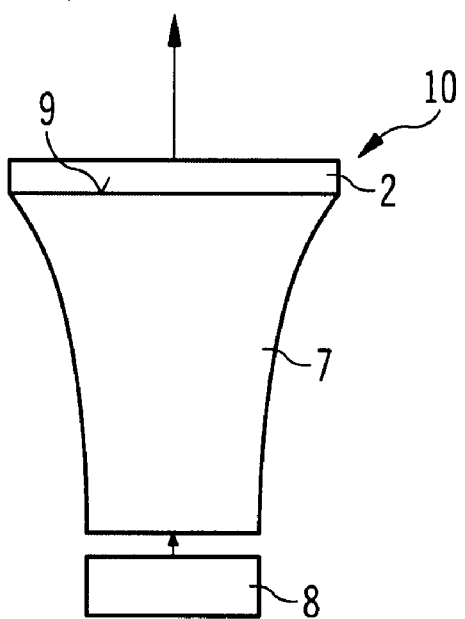
FIG. 17 is a schematic cross-sectional view of a fifteenth exemplary embodiment of a radiation-emitting component according to the invention.

The radiation-emitting component 10 which is illustrated in FIG. 17 comprises a thin film semiconductor chip 8 and an optical element 7 for increasing the luminance. The optical element 7 is arranged near to the chip and is preferably embodied as a mirrored concentrator. In addition, the radiation-emitting component 10 comprises a filter element 2 which is, in particular, a light-directing film, for example BEF. The filter element 2 is applied to a radiation transmitting face 9 of the optical element 7. In this exemplary embodiment, the filter element 2 is arranged on a side of the optical element 7 facing away from the thin film semiconductor chip 8.

Figure 18:
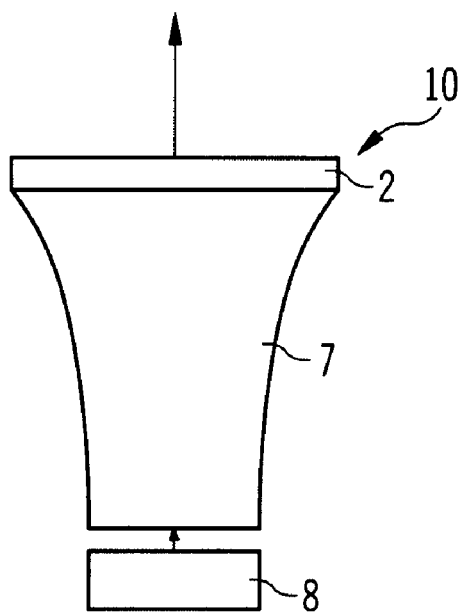
FIG. 18 is a schematic cross-sectional view of a sixteenth exemplary embodiment of a radiation-emitting component according to the invention.

A radiation-emitting component 10 which comprises a thin film semiconductor chip 8 with optical element 7 near to the chip, in particular a mirrored concentrator, and a filter element 2 which is embodied as a polarization filter for producing polarized light is illustrated in FIG. 18. An advantage with such a structure is that the polarization filter whose effect is direction dependent can be used more efficiently by means of the concentrator since the concentrator already orientates the light beams in a suitable way.

Figure 19:
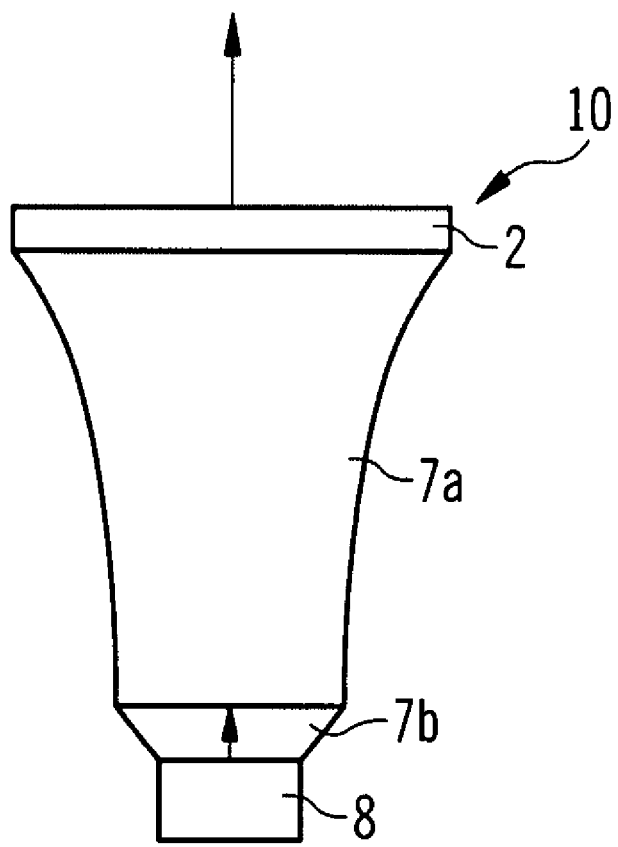
FIG. 19 is a schematic cross-sectional view of a seventeenth exemplary embodiment of a radiation-emitting component according to the invention.

The radiation-emitting component 10 illustrated in FIG. 19 comprises an arrangement which corresponds to FIGS. 17 and 18, with the component 10 having a further optical element 7b which is embodied as a reflector. The further optical element 7b is arranged underneath the input face of the optical element 7a which is embodied as a concentrator.

Figure 20:
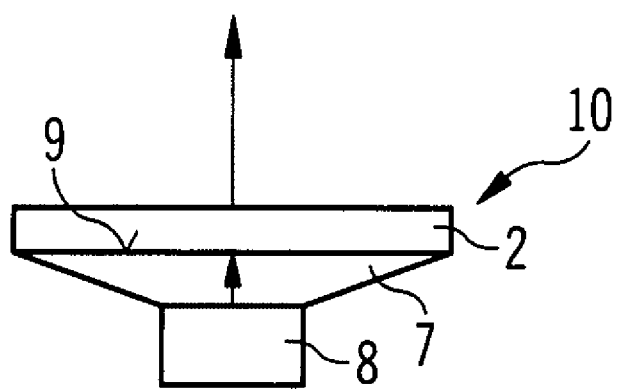
FIG. 20 is a schematic cross-sectional view of an eighteenth exemplary embodiment of a radiation-emitting component according to the invention.

FIG. 20 illustrates a radiation-emitting component 10 which has an arrangement corresponding to FIGS. 17 to 20, with the optical element 7 not being embodied as a concentrator but rather as a reflector, on whose radiation transmitting face 9 the filter element 2 is mounted. The filter element 2 is reflective to the non-transmitted radiation component. For example, the filter element 2 can be a light-directing film or a polarization film.

The invention is not restricted by the description using the exemplary embodiments. Instead, the invention comprises any new feature as well as any combination of features and this includes in particular any combination of features in the patent claims even if this feature or this combination itself is not explicitly specified in the patent claims or exemplary embodiments.

We claim:

1. A radiation-emitting component comprising:
    a layer stack which is based on a semiconductor material and which has an active layer sequence for generating electromagnetic radiation,
    a filter element which is arranged after the active layer sequence in an irradiation direction, the filter element being a polarization filter and comprising a metal grid,
    wherein the filter element transmits a first radiation component and reflects a second radiation component into the layer stack,
    wherein, after reflection at the filter element, the second radiation component is subjected to a deflection process or an absorption and emission process,
    wherein the deflected or emitted radiation impinges on the filter element again,
    wherein the metal grid comprises metal strips running parallel to one edge of the layer stack, and
    wherein the layer stack is structured such that the metal strips extend on raised portions of the layer stack.

2. The radiation-emitting component as claimed in claim 1, wherein the first radiation component is composed of light beams which, when they impinge on the filter element lie within a first spatial angle range, while the second radiation component is composed of light beams which, when they impinge on the filter element lie within a second spatial angle range which is different from the first spatial angle range.

3. The radiation-emitting component as claimed in claim 2, wherein the filter element is a spatial angle filter.

4. The radiation-emitting component as claimed in claim 3, wherein the filter element comprises at least one planar layer which contains a radiation-transmissive material.

5. The radiation-emitting component as claimed in claim 4, wherein the at least one planar layer contains a material with a refractive index which is lower than the refractive index of the semiconductor material of the layer stack.

6. The radiation-emitting component as claimed in claim 4, wherein the at least one layer contains a silicon oxide, silicon nitride, silicon oxynitride, aluminum oxide, titanium oxide, tantalum oxide, a glass material or a TCO.

7. The radiation-emitting component as claimed in claim 1, wherein the filter element is a photonic crystal.

8. The radiation-emitting component as claimed in claim 1, wherein the first radiation component, after impinging on the filter element, comprises linearly polarized light beams with a first polarization direction, and the second radiation component, after impinging on the filter element, comprises linearly polarized light beams perpendicular to the first polarization direction.

9. The radiation-emitting component as claimed in claim 1, wherein the filter element contains at least one birefringent material.

10. The radiation-emitting component as claimed in claim 9, wherein the filter element comprises at least one first birefringent layer with a first refractive index n1 and a second refractive index n, and at least one second birefringent layer with a third refractive index n2 and the second refractive index n.

11. The radiation-emitting component as claimed in claim 10, wherein the second layer is arranged after the first layer in the irradiation direction.

12. The radiation-emitting component as claimed in claim 10, wherein the first and second layers have an optical thickness of $\lambda/4$.

13. The radiation-emitting component as claimed in claim 1, wherein the filter element is a photonic crystal.

14. The radiation-emitting component as claimed in claim 1, wherein a reflective layer is arranged on a side of the active layer sequence lying opposite the filter element.

15. The radiation-emitting component as claimed in claim 14, wherein the reflective layer contains a metal.

16. The radiation-emitting component as claimed in claim 14, wherein the reflective layer is arranged on a carrier substrate.

17. The radiation-emitting component as claimed in claim 14, wherein a scattering layer is arranged between the active layer sequence and the reflective layer.

18. The radiation-emitting component as claimed in claim 1, wherein the layer stack is a thin-film semiconductor element.

19. The radiation-emitting component as claimed in claim 1, which comprises an optical element which is arranged after the layer stack in the irradiation direction, wherein the filter element is arranged on a radiation-transmitting surface of the optical element.

20. The radiation-emitting component as claimed in claim 19, wherein the optical element is a reflector and/or concentrator.

21. The radiation-emitting component as claimed in claim 1, wherein the metal strips are in direct contact with the semiconductor material of the layer stack of the radiation-emitting component.

22. A radiation-emitting component comprising:
    a layer stack which is based on a semiconductor material and which has an active layer sequence for generating electromagnetic radiation; and
    a filter element which is arranged after the active layer sequence in a irradiation direction, the filter element transmitting a first radiation component and reflecting a second radiation component into the layer stack;
    wherein, after reflection at the filter element, the second radiation component is subjected to a deflection process or an absorption and emission process,
    wherein the deflected or emitted radiation impinges on the filter element again,
    wherein the filter element is a polarization filter and comprises at least one first birefringent layer with a first refractive index n1 and a second refractive index n, and at least one second birefringent layer with a third refractive index n2 and the second refractive index n, and
    wherein the first and second birefringent layers have an optical thickness of $\lambda/4$.

* * * * *